United States Patent [19]
Kim et al.

[11] Patent Number: 5,986,953
[45] Date of Patent: Nov. 16, 1999

[54] INPUT/OUTPUT CIRCUITS AND METHODS FOR TESTING INTEGRATED CIRCUIT MEMORY DEVICES

[75] Inventors: Tae-hyun Kim, Seoul; Kye-hyun Kyung, Kyungki-do, both of Rep. of Korea

[73] Assignee: Samsung Electronics Co., Ltd., Rep. of Korea

[21] Appl. No.: 09/073,621

[22] Filed: May 6, 1998

[30] Foreign Application Priority Data

Nov. 18, 1997 [KR] Rep. of Korea .................. 97-60815

[51] Int. Cl.[6] ............................. G11C 7/00; G11C 29/00
[52] U.S. Cl. ............... 365/201; 365/189.01; 365/189.02; 365/189.03; 365/189.05
[58] Field of Search .................... 365/189.01, 189.02, 365/201, 189.03, 189.05; 371/22.5

[56] References Cited

U.S. PATENT DOCUMENTS

| | | | |
|---|---|---|---|
| 5,260,906 | 11/1993 | Mizukami | 365/201 |
| 5,367,492 | 11/1994 | Kawamoto et al. | 365/201 |
| 5,379,308 | 1/1995 | Nguyen et al. | 371/226 |
| 5,506,499 | 4/1996 | Puar | 324/158.1 |
| 5,568,437 | 10/1996 | Jamal | 365/201 |
| 5,577,052 | 11/1996 | Morris | 371/22.5 |
| 5,592,422 | 1/1997 | McClure | 365/201 |
| 5,659,514 | 8/1997 | Hazani | 365/218 |
| 5,677,885 | 10/1997 | Roohparvar | 365/201 |
| 5,793,685 | 8/1998 | Suma | 365/201 |

*Primary Examiner*—Viet Q. Nguyen
*Attorney, Agent, or Firm*—Myers Bigel Sibley & Sajovec

[57] ABSTRACT

Integrated circuit memory devices include a plurality of pads that receive signals from external of the memory device and a plurality of data buses, a respective one of which is operatively connected to a respective one of the plurality of pads. A plurality of multiplexers is provided, a respective one of which is operatively connected to a respective one of the pads and to each of the data buses, to write data from the data buses to the memory cell in a direct access test mode, and to write data from the respective one of the pads to the memory cell array in a normal mode. The integrated circuit memory devices also preferably include a plurality of input/output devices, a respective one of which operatively connects the respective one of the pads to the respective one of the multiplexers. The plurality of input/output devices preferably are a plurality of pipelines that store signals that are serially received from external of the memory device, and that provide the stored signals to the multiplexers.

14 Claims, 4 Drawing Sheets

INPUT/OUTPUT CIRCUITS AND METHODS FOR TESTING INTEGRATED CIRCUIT MEMORY DEVICES

FIELD OF THE INVENTION

The present invention relates to integrated circuit memory devices, and more particularly to circuits and methods for testing integrated circuit memory devices.

BACKGROUND OF THE INVENTION

High-speed integrated circuit memory devices may include a dynamic random access memory (DRAM), an input/output unit that receives an external signal, and an interface logic unit that receives a command from the input/output unit and decodes the received command. The DRAM may be tested in a direct access test mode. In the direct access test mode, test signals output by low frequency testing equipment bypass the interface logic and proceed directly to the DRAM, so that the low frequency testing equipment can test the DRAM.

FIG. 1 is a block diagram of a high-speed integrated circuit memory device including an input/output circuit. Referring to FIG. 1, a conventional high-speed memory device 101 includes first through eighth pads P0 through P7, first through eighth input pipelines 121 through 128, first through fourth buffers 131 through 134 and a memory cell array such as a DRAM cell array 111. The high-speed memory device 101 receives a test row address strobe signal (TRASB), a test column address strobe signal (TCASB), a test write enable signal (TWE), a test latch enable signal (TWL), a test clock signal (TCLK), a row address signal (RADR) and a column address signal (CADR) from external of the device 101.

FIG. 2 shows the waveforms of signals for writing data in the DRAM cell array 111 of FIG. 1. A method of writing data in the DRAM cell array 111 of a high-speed memory device in the direct access test mode will now be described referring to FIGS. 1 and 2.

In order to select memory cells of the DRAM cell array 111, the test write enable signal TWE is activated to logic high. In this state, when the row address signal RADR and the column address signal CADR are input to the DRAM cell array 111, particular cells of the DRAM cell array 111 are selected. The row address signal RADR is input to the first through fourth buffers 131 through 134 via the first through fourth pads P0 through P3 when the test row address strobe signal TRASB is activated to logic low. The column address signal CADR is input to the first through fourth buffers 131 through 134 via the first through fourth pads P0 through P3 when a column latency signal COLLAT which is generated when the test column address strobe signal TCASB is activated to logic low, is activated to logic high. The direct access test signal PDA is activated to logic high in the direct access test mode, so that the row and column address signals RADR and CADR input to the first through fourth buffers 131 through 134 are transmitted to the DRAM cell array 111 to select the particular cells of the DRAM cell array 111.

After the row and column address signals RADR and CADR are input to the DRAM cell array 111, the test clock signal TCLK is generated. During four cycles of the test clock signal TCLK, data to be written in the DRAM cell array 111 from external of the memory device is latched to the first through eighth input pipelines 121 through 128 via the first through eighth pads P0 through P7. The data latched to the first through eighth input pipelines 121 through 128 is written to the DRAM cell array 111 when a column cycle signal COLCYC that is generated as the test column address strobe signal TCASB is inactivated to logic high, is activated to logic high.

As described above, a test pad is allocated for each data bit to test the DRAM cell array 111 of a conventional high-speed memory device 101. Accordingly, it may be difficult for the test equipment to test several high-speed memory devices simultaneously due to the limited number of test pads. Thus, long times may be needed to test several high-speed memory devices. Also, a conventional DRAM memory device may not receive data via the first through eighth input pipelines 121 through 128 during four cycles of the test clock signal TCLK. Therefore, the time for testing the DRAM memory cell array of a high-speed memory device may increase significantly compared to testing a conventional memory device.

SUMMARY OF THE INVENTION

It is therefore an object of the present invention to provide improved testing circuits and methods for integrated circuit memory devices.

It is another object of the present invention to provide testing circuits and methods for integrated circuit memory devices that can reduce testing time for the integrated circuit memory devices.

These and other objects are provided, according to the invention, by integrated circuit memory devices that include a plurality of pads that receive signals from external of the memory device and a plurality of data buses, a respective one of which is operatively connected to a respective one of the plurality of pads. A plurality of multiplexers is provided, a respective one of which is operatively connected to a respective one of the pads and to each of the data buses, to write data from the data buses to the memory cell in a direct access test mode, and to write data from the respective one of the pads to the memory cell array in a normal mode. It will be understood that when an element is referred to as being operatively connected to another element, it can be directly connected to the other element or intervening elements may also be present, as long as the elements cooperate with one another. Accordingly, the time for writing data in memory during direct access test mode may be reduced.

Integrated circuit memory devices according to the invention also preferably include a plurality of input/output devices, a respective one of which operatively connects the respective one of the pads to the respective one of the multiplexers. The plurality of input/output devices preferably are a plurality of pipelines that store signals that are serially received from external of the memory device, and that provide the stored signals to the multiplexers.

The multiplexers are preferably responsive to a direct access test signal. The multiplexers write data from the data buses to the memory cell arrays when the direct access test signal is active and write data from the respective one of the pads to the memory cell array when the direct access test signal is inactive.

A plurality of second pads may also be provided that receive address signals from external of the memory device and that are not operatively connected to the data buses. A plurality of buffers is also provided, a respective one of which is operatively connected to a respective one of the second pads and to the memory cell array, to provide the address signals to the memory cell array in the direct access test mode. A plurality of second multiplexers may also be provided a respective one of which is operatively connected to a respective one of the second pads and to each of the data buses. A plurality of second input/output devices may also be provided, a respective one of which operatively connects the respective one of the second pads to the respective one of the second multiplexers.

Accordingly, means and methods are provided for writing data from the data buses to the memory cell array in a direct access test mode and for writing data from a respective one of the pads to the memory cell array in a normal mode. The writing means and methods are preferably responsive to a direct access test signal for writing data from the data buses to the memory cell array when the direct access test signal is active and for writing data from the respective one of the pads to the memory cell array when the direct access test signal inactive. High speed integrated circuit memory devices can thereby be tested rapidly.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
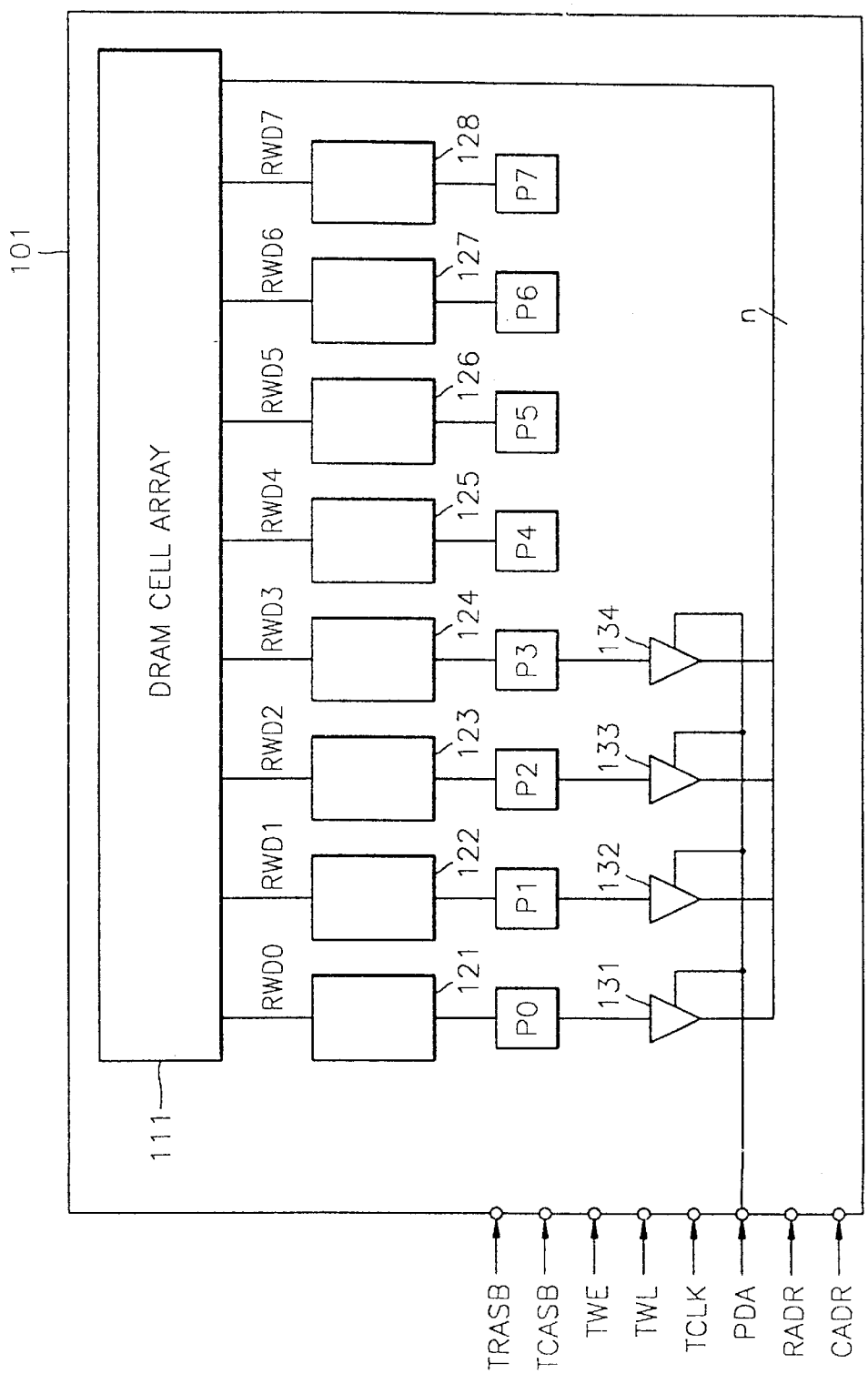
FIG. 1 is a block diagram of a conventional high-speed integrated circuit memory device including an input-output circuit.
Figure 2:
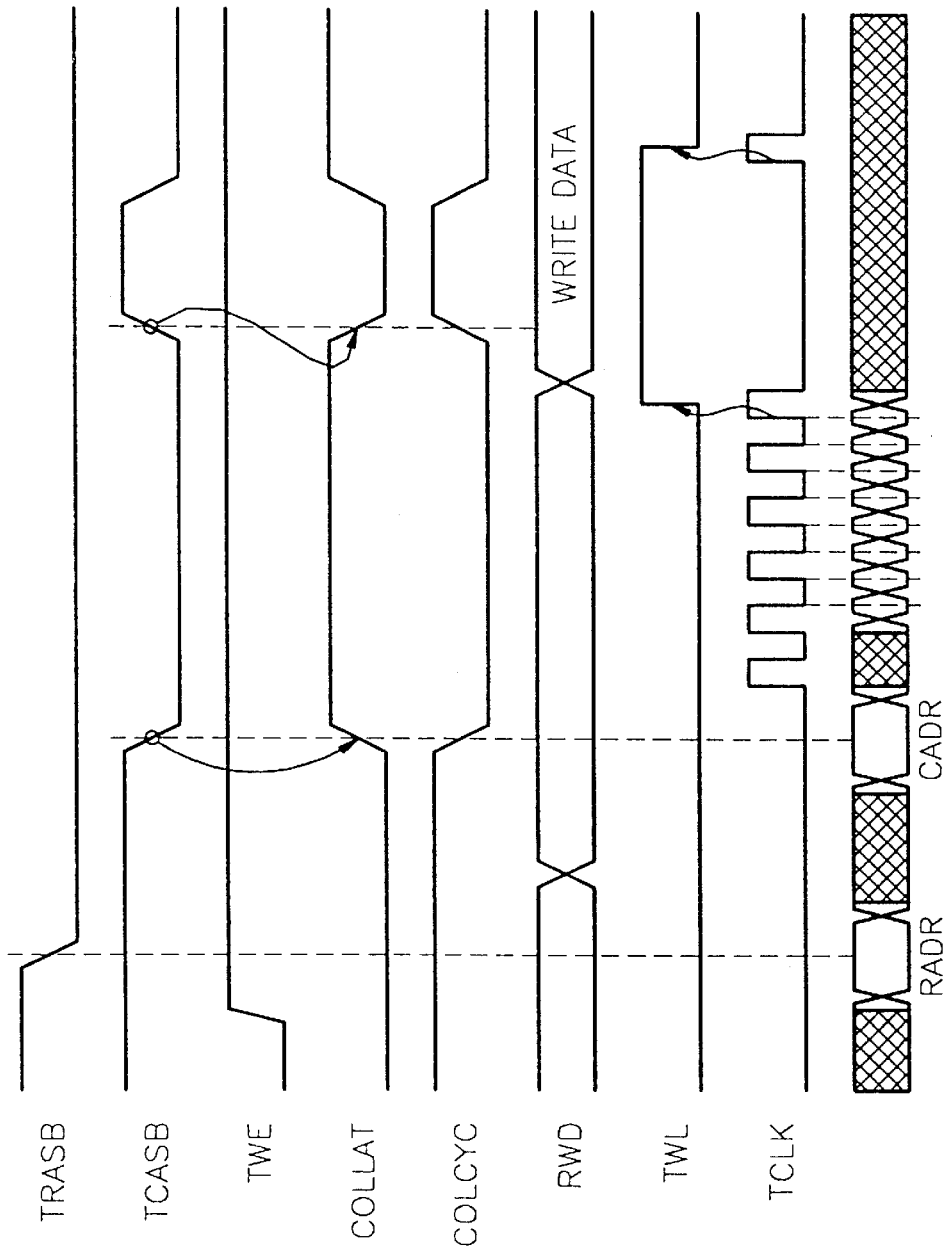
FIG. 2 is a timing diagram of waveforms of signals for writing data in the memory shown in FIG. 1.
Figure 3:
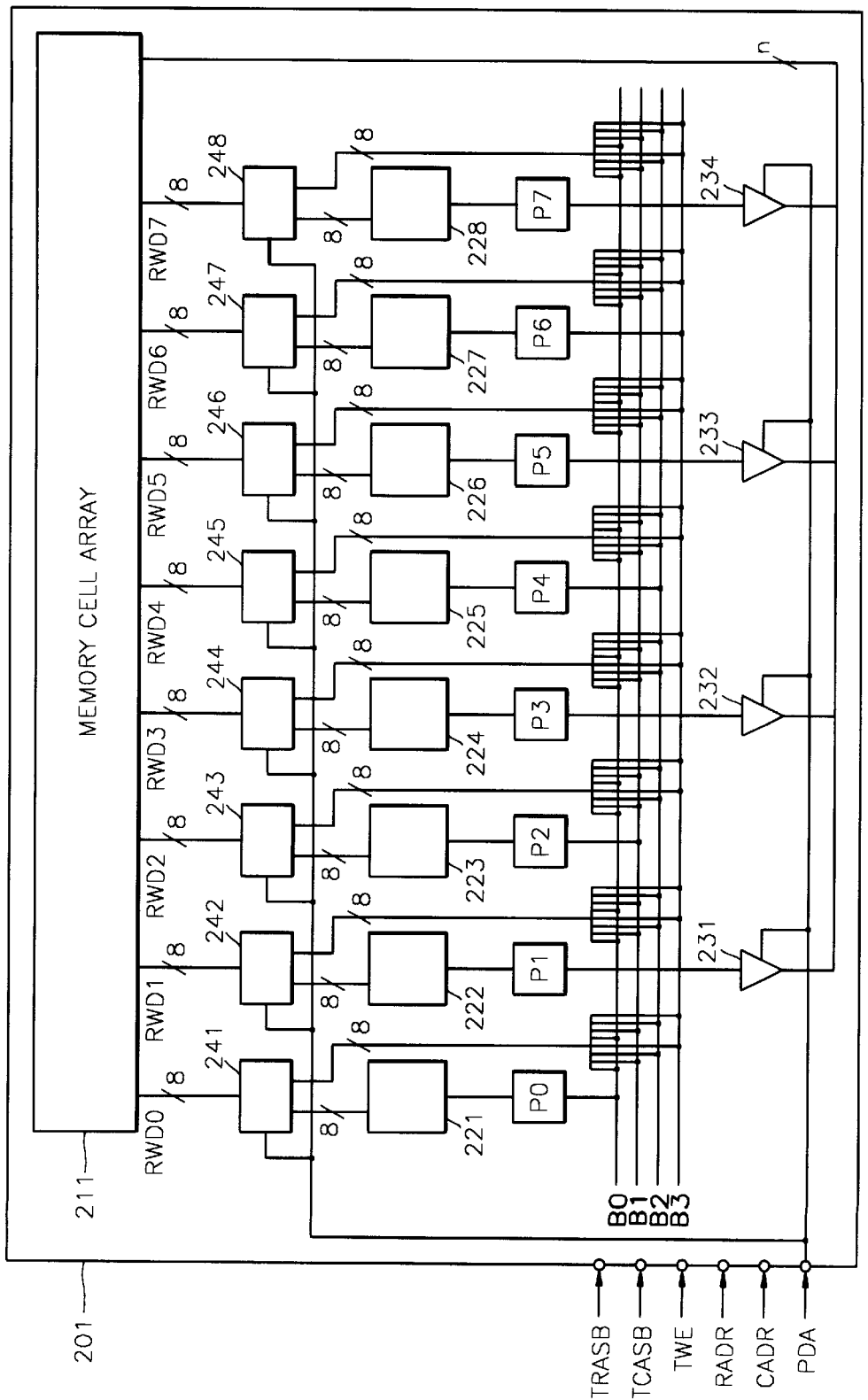
FIG. 3 is a block diagram of integrated circuit memory devices including input/output circuits according to the present invention.

Referring to FIG. 3, an integrated circuit memory device 201 according to the present invention includes a memory cell array 211, first through eighth pads P0 through P7, first through eighth input/output devices 221 through 228, first through eighth multiplexers 241 through 248, first through fourth data buses B0 to B3 and first through fourth buffers 231 through 234. The memory device 201 receives a test row address strobe signal (TRASB), a test column address strobe signal (TCASB), a test write enable signal (TWE), a test latch enable signal (TWL), a test clock signal (TCLK), a row address signal (RADR) and a column address signal (CADR) from an external source. The memory cell array 211 is preferably a dynamic random access memory (DRAM).

The first through eighth pads P0 through P7 output and receive signals to and from an external source. The first through eighth pads P0 through P7 are electrically connected to the input ports of the first through eighth input/output devices 221 through 228, respectively. In a direct access test mode, data is applied to only the first, third, fifth and seventh pads P0, P2, P4 and P6 from an external source. The data applied to the first, third, fifth and seventh pads P0, P2, P4 and P6 is transmitted to the first, third, fifth and seventh input/output devices 221, 223, 225 and 227. The data input from an external source is also transmitted to the first through fourth data buses B0 through B3 via the first, third, fifth and seventh pads P0, P2, P4 and P6, and the data in the first through fourth buses B0 through B3 is transmitted to the first through eighth multiplexers 241 to 248.

The first through eighth input/output devices 221 through 228 are connected between the first through eighth pads P0 through P7 and the first through eighth multiplexers 241 through 248. The first through eighth input/output devices 221 through 228 preferably comprise input pipelines which transmit data, transmitted from the first through eighth pads P0 through P7 in a normal mode (as opposed to a test mode), to the first through eighth multiplexers 241 through 248.

The first through fourth data buses B0 through B3 are electrically connected to the first, third, fifth and seventh pads P0, P2, P4 and P6, respectively. The first through fourth data buses B0 through B3 are also connected to the first through eighth multiplexers 241 through 248 via two lines for each multiplexer, respectively. Therefore, each of the first through eighth multiplexers 241 through 248 receives 8 bit data from the first through fourth data buses B0 through B3.

The second, fourth, sixth and eighth pads P1, P3, P5 and P7 are connected to the input ports of the first through fourth buffers 231 through 234, respectively. The row and column address signals RADR and CADR are input to the first through fourth buffers 231 through 234 via the second, fourth, sixth and eighth pads P1, P3, P5 and P7. A direct access test signal PDA is applied to the respective control ports of the first through fourth buffers 231 through 234. Accordingly, when the direct access test signal PDA is activated to logic high, the first through fourth buffers 231 through 234 transmit the row and column address signals RADR and CADR input from the second, fourth, sixth and eighth pads P1, P3, P5 and P7 to the memory cell array 211. That is, the particular cells in the memory cell array 211 are selected by the row and column address signals RADR and CADR. When data is output from the first through eighth multiplexers 241 through 248 when the particular cells in the memory cell array 211 have been selected, the data is written in the particular cells in the memory cell array 211. When the direct access test signal PDA is inactivated to logic low, the first through fourth buffers 231 through 234 do not output the address signals input from the second, fourth, sixth and eighth pads P1, P3, P5 and P7.

The output ports of the first through eighth multiplexers 241 through 248 are connected to the memory cell array 211. The direct access test signal PDA is applied to the respective control ports of the first through eighth multiplexers 241 through 248. When the direct access test signal PDA is activated to logic high, that is in a direct access test mode, the first through eighth multiplexers 241 through 248 output data transmitted from the first through fourth buses B0 through B3. When the direct access test signal PDA is inactivated to logic low, that is in a normal mode, the first through eighth multiplexers 241 through 248 output data transmitted from the first through eighth input/output devices 221 through 228.

Figure 4:
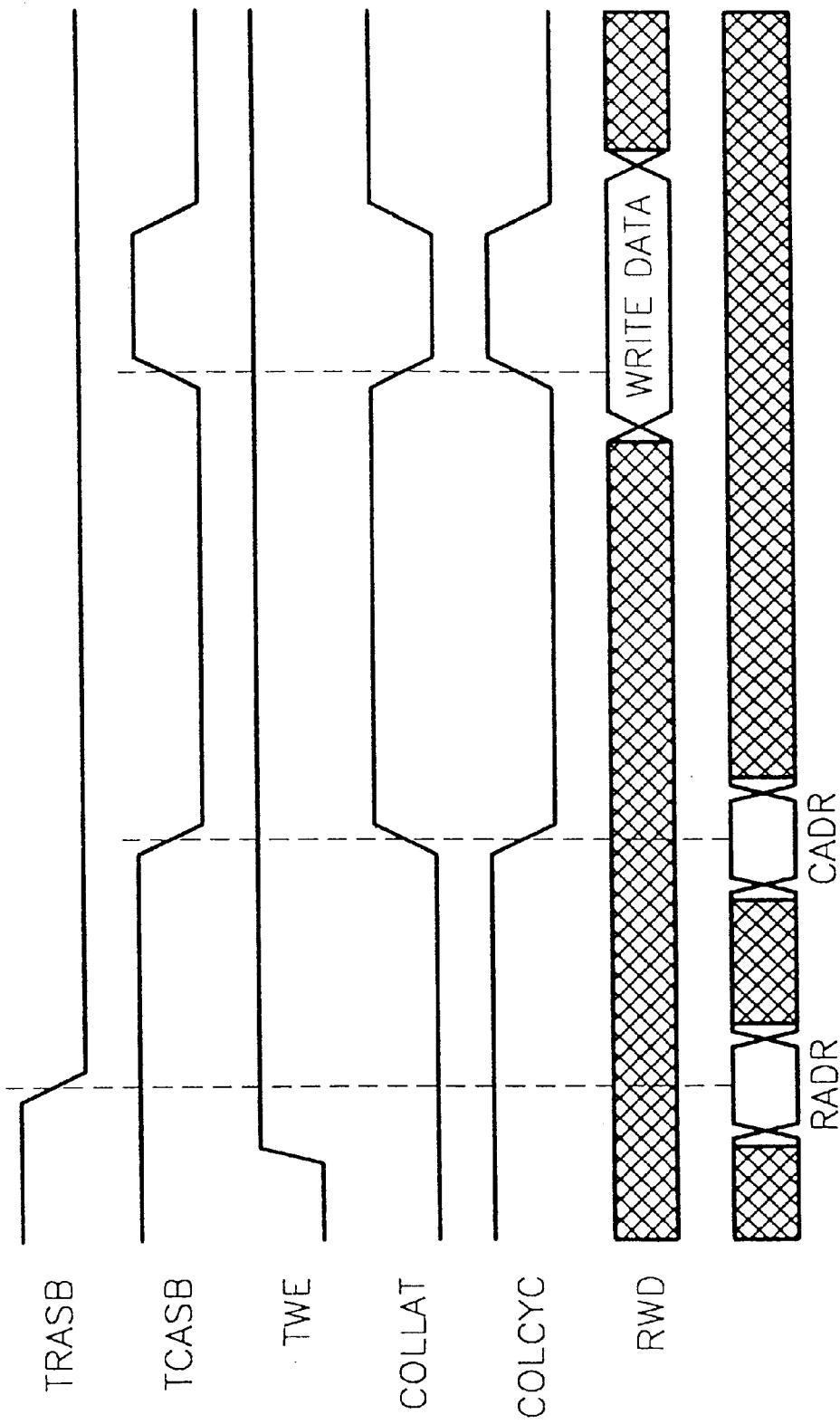
FIG. 4 is a timing diagram of waveforms of signals for writing data in the memory shown in FIG. 3.

FIG. 4 is a timing diagram of the waveforms of signals when data is written in the memory cell array 211 shown in FIG. 3. Referring to FIG. 4, when a test write enable signal TWE, enabling writing of data in the memory cell array 211, is activated to logic high in the direct access test mode, if the test row address strobe signal TRASB is activated to logic low, the row address signal RADR is input. If a column latency signal COLLAT that is generated when the column address strobe signal TCASB is activated to logic low, is itself activated to logic high, the column address signal CADR is input. In this state, if the column cycle signal COLCYC that is generated when the column address strobe signal TCASB is activated to logic high, is itself activated to logic high, data input from external to the memory device 201 is written in the memory cell array 211.

Operation of the input/output circuit shown in FIG. 3 will now be described referring to FIG. 4.

In order to test the memory cell array 211 in the direct access test mode, first, the direct access test signal PDA is activated to logic high. In this state, in order to test whether or not the memory cell array 211 operates normally, predetermined data is written into the memory cell array 211 and then the data written in the memory cell array 211 is read. If the read data is identical to the data written in the memory cell array 211, it is determined that the memory cell array 211 operates normally.

In order to write predetermined data in the memory cell array 211 in the direct access test mode, the test write enable signal TWE for controlling writing of data in the memory cell array 211 is activated to logic high. After the test write enable signal TWE is activated, if the test row and column address strobe signals TRASB and TCASB are activated to logic low, the row and column address signals RADR and CADR applied to the second, fourth, sixth and eighth pads P1, P3, P5 and P7 are transmitted to the memory cell array 211 via the first through fourth buffers 231 through 234, respectively. Then, the particular cells in the memory cell array 211 are selected.

Next, when external data is applied to the first, third, fifth and seventh pads P0, P2, P4 and P6, the data is input to the first through eighth multiplexers 241 through 248 via the first through fourth buses B0 through B3. When the direct access test signal PDA is active in the direct access test mode, data RWD0 through RWD7 output from the first through eighth multiplexers 241 through 248 are transmitted to the memory cell array 211. The data transmitted to the memory cell array 211 are stored in the particular cells selected by the row and column address signals RADR and CADR.

Data RWD0 through RWD7 which is written from the first through eighth multiplexers 241 through 248 in the memory cell array 211 is expressed in the following table:

signal TCLK is generated, the present invention need not transmit data to the first through eighth input/output devices 121 through 128. Thus, the time for writing data in the memory cell array 211 in the direct access test mode may be sharply reduced. The reduction in the time for writing data in the memory cell array 211 can provide a reduction in the testing time in the direct access test mode. Also, the pads P1, P3, P5 and P7 to which the row and column address signals RADR and CADR are applied are separated from the pads P0, P2, P4 and P6 to which data is applied. Accordingly test equipment which does not support multiplexing can test the memory cell array 211 in the direct access test mode.

According to the present invention as described above, the testing time in the direct access test mode can be reduced, and test equipment which does not support multiplexing can test the memory of a high-speed semiconductor memory device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a memory cell array;
   a plurality of pads that receive signals from external of the memory device;
   a plurality of data buses, a respective one of which is operatively connected to a respective one of the plurality of pads;
   a plurality of multiplexers, a respective one of which is operatively connected to a respective one of the pads and to each of the data buses, to write data from the data buses to the memory cell array in a direct access test mode and to write data from the respective one of the pads to the memory cell array in a normal mode; and
   a plurality of input/output devices, a respective one of which operatively connects the respective one of the pads to the respective one of the multiplexers.

2. An integrated circuit memory device according to claim 1 wherein the plurality of input/output devices comprise a plurality of pipelines that store signals that are serially received from external of the memory device, and that provide the stored signals to the multiplexers.

TABLE

|  | RWD 0 | RWD 1 | RWD 2 | RWD 3 | RWD 4 | RWD 5 | RWD 6 | RWD 7 |
|---|---|---|---|---|---|---|---|---|
| P0, P2, P4, P6 = 0000 | 0 | 0 | 0 | 0 | 0 | 0 | 0 | 0 |
| P0, P2, P4, P6 = 1111 | 1 | 1 | 1 | 1 | 1 | 1 | 1 | 1 |
| P0, P2, P4, P6 = 0101 | 0 | 1 | 0 | 1 | 0 | 1 | 0 | 1 |
| P0, P2, P4, P6 = 1010 | 1 | 0 | 1 | 0 | 1 | 0 | 1 | 0 |

As shown in the Table, when data '1' is applied to the first, third, fifth and seventh pads P0, P2, P4 and P6, a '1' pattern is written in the memory cell array 211, but when data '0' is applied thereto, a '0' pattern is written therein. If the data '1' and '0' are alternatively applied to the first, third, fifth and seventh pads P0, P2, P4 and P6, a checkerboard pattern such as '10101010' or '01010101' is written in the memory cell array 211.

When data is written in the memory cell array 211 in the direct access test mode, the first through eighth input/output devices 221 through 228 which are used in the normal mode are not used. Therefore, when the conventional test clock 3. An integrated circuit memory device comprising:
   a memory cell array;
   a plurality of pads that receive signals from external of the memory device;
   a plurality of data buses a respective one of which is operatively connected to a respective one of the plurality of pads; and
   a plurality of multiplexers a respective one of which is operatively connected to a respective one of the pads and to each of the data buses, to write data from the data buses to the memory cell array in a direct access test mode and to write data from the respective one of the pads to the memory cell array in a normal mode; wherein the multiplexers are responsive to a direct access test signal, to write data from the data buses to the memory cell array when the direct access test signal is active and to write data from the respective one of the pads to the memory cell array when the direct access test signal is inactive.

4. An integrated circuit memory device comprising:

a memory cell array;

a plurality of first pads that receive signals from external of the memory device;

a plurality of data buses a respective one of which is operatively connected to a respective one of the plurality of first pads;

a plurality of multiplexers a respective one of which is operatively connected to a respective one of the first pads and to each of the data buses, to write data from the data buses to the memory cell array in a direct access test mode and to write data from the respective one of the first pads to the memory cell array in a normal mode;

a plurality of second pads that receive address signals from external of the memory device and that are not operatively connected to the data buses; and a plurality of buffers, a respective one of which is operatively connected to a respective one of the second pads and to the memory cell array, to provide the address signals to the memory cell array in the direct access test mode.

5. An integrated circuit memory device according to claim 4 further comprising:

a plurality of second multiplexers, a respective one of which is operatively connected to a respective one of the second pads and to each of the data buses.

6. An integrated circuit memory device according to claim 5 further comprising:

a plurality of second input/output devices, a respective one of which operatively connects the respective one of the second pads to the respective one of the second multiplexers.

7. An integrated circuit memory device comprising:

a memory cell array;

a plurality of first pads that receive signals from external of the memory device;

a plurality of data buses, a respective one of which is operatively connected to a respective one of the plurality of first pads;

means for writing data from the data buses to the memory cell array in a direct access test mode and for writing data from the respective one of the first pads to the memory cell array in a normal mode;

a plurality of second pads that receive address signals from external of the memory device and that are not operatively connected to the data buses; and means for providing the address signals from the plurality of second pads to the memory cell array in the direct access test mode.

8. An integrated circuit memory device according to claim 7 wherein the means for writing is responsive to a direct access test signal, for writing data from the data buses to the memory cell array when the direct access test signal is active and for writing data from the respective one of the pads to the memory cell array when the direct access test signal is inactive.

9. A method of testing an integrated circuit memory device comprising a memory cell array, a plurality of pads that receive signals from external of the memory device and a plurality of data buses, a respective one of which is operatively connected to a respective one of the plurality of pads, the testing method comprising the steps of:

writing data from the data buses to the memory cell array in a direct access test mode;

storing, data that is serially received at the respective one of the pads in a normal mode; and writing the stored data from the respective one of the pads to the memory cell array in the normal mode.

10. A method of testing an integrated circuit memory device comprising a memory cell array, a plurality of first pads that receive signals from external of the memory device a plurality of data buses a respective one of which is operatively connected to a respective one of the plurality of first pads and a plurality of second pads that receive address signals from external of the memory device and that are not operatively connected to the data buses the testing method comprising the steps of:

writing data from the data buses to the memory cell array in a direct access test mode; and writing data from the respective one of the first pads to the memory cell array in a normal mode; and providing the address signals from the plurality of second pads to the memory cell array in the direct access test mode.

11. An integrated circuit memory device according to claim 1 wherein a respective pad is connected to a respective data bus and a respective data bus is connected to a respective multiplexer via at least two data lines in the direct access test mode.

12. An integrated circuit memory device according to claim 3 wherein a respective pad is connected to a respective data bus and a respective data bus is connected to a respective multiplexer via at least two data lines in the direct access test mode.

13. An integrated circuit memory device according to claim 4 wherein a respective pad is connected to a respective data bus and a respective data bus is connected to a respective multiplexer via at least two data lines in the direct access test mode.

14. An integrated circuit memory device according to claim 7 wherein a respective pad is connected to a respective data bus and a respective data bus is connected to a respective multiplexer via at least two data lines in the direct access test mode.

* * * * *